(12) United States Patent
Ishida et al.

(10) Patent No.: US 10,249,431 B2
(45) Date of Patent: Apr. 2, 2019

(54) ELECTRONIC COMPONENT

(71) Applicant: MURATA MANUFACTURING CO., LTD., Kyoto-fu (JP)

(72) Inventors: Kosuke Ishida, Nagaokakyo (JP); Katsufumi Sasaki, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 267 days.

(21) Appl. No.: 15/450,541

(22) Filed: Mar. 6, 2017

(65) Prior Publication Data

US 2017/0309396 A1 Oct. 26, 2017

(30) Foreign Application Priority Data

Apr. 21, 2016 (JP) ................................ 2016-084994

(51) Int. Cl.
*H01G 4/30* (2006.01)
*H01G 4/005* (2006.01)
(Continued)

(52) U.S. Cl.
CPC ......... *H01F 27/40* (2013.01); *H01F 17/0013* (2013.01); *H01F 27/24* (2013.01);
(Continued)

(58) Field of Classification Search
CPC ................................. H01G 4/30; H01G 4/232
(Continued)

(56) References Cited

U.S. PATENT DOCUMENTS 10,115,521 B2 * 10/2018 Hamada ............... H01F 17/0013
2015/0116899 A1 * 4/2015 Kayatani ................. H01G 4/30
361/301.4
(Continued)

FOREIGN PATENT DOCUMENTS

JP H11-284471 A 10/1999
JP 2000-013167 A 1/2000
(Continued)

OTHER PUBLICATIONS

An Office Action; "Notification of Reasons for Refusal," Mailed by the Japanese Patent Office dated Oct. 16, 2018, which corresponds to Japanese Patent Application No. 2016-084994 and is related to U.S. Appl. No. 15/450,541; with English language translation.

*Primary Examiner* — Dharti H Patel
(74) *Attorney, Agent, or Firm* — Studebaker & Brackett PC (57) ABSTRACT

An electronic component includes a first outer electrode, a second outer electrode, a third outer electrode, and a fourth outer electrode which are provided to correspond to four corners of a second main surface; a fifth outer electrode which is provided on the second main surface; a multilayer body; a first inductor which includes a first end portion and a second end portion; and a first surface mounted electronic component which is mounted on the multilayer body and which includes a sixth outer electrode and a seventh outer electrode. The first end portion is electrically connected to the first outer electrode. The second end portion is electrically connected to the second outer electrode and the sixth outer electrode. The seventh outer electrode is electrically connected to the fifth outer electrode.

12 Claims, 3 Drawing Sheets

(51) Int. Cl.
  *H01G 4/228* (2006.01)
  *H01F 27/40* (2006.01)
  *H01F 27/24* (2006.01)
  *H01F 27/28* (2006.01)
  *H01G 4/40* (2006.01)
  *H03H 1/00* (2006.01)
  *H01F 17/00* (2006.01)
  *H01F 27/29* (2006.01)
  *H01G 2/06* (2006.01)

(52) U.S. Cl.
  CPC ....... *H01F 27/2804* (2013.01); *H01F 27/292* (2013.01); *H01G 2/065* (2013.01); *H01G 4/005* (2013.01); *H01G 4/228* (2013.01); *H01G 4/30* (2013.01); *H01G 4/40* (2013.01); *H03H 1/00* (2013.01); *H01F 2027/2809* (2013.01); *H03H 1/0007* (2013.01); *H03H 2001/0021* (2013.01); *H03H 2001/0057* (2013.01); *H03H 2001/0078* (2013.01); *H03H 2001/0085* (2013.01)

(58) Field of Classification Search
  USPC ........................................................ 361/270
  See application file for complete search history.

(56) References Cited

U.S. PATENT DOCUMENTS

| | | | |
|---|---|---|---|
| 2015/0221441 A1* | 8/2015 | Katsuyama | H01G 4/30 361/301.4 |
| 2016/0073499 A1* | 3/2016 | Ogawa | H01L 23/3121 361/736 |
| 2016/0165720 A1* | 6/2016 | Nishino | H05K 3/4632 361/790 |

FOREIGN PATENT DOCUMENTS

| | | |
|---|---|---|
| JP | 2010-238777 A | 10/2010 |
| JP | 2016-036150 A | 3/2016 |

* cited by examiner

ELECTRONIC COMPONENT

CROSS REFERENCE TO RELATED APPLICATIONS

This application claims benefit of priority to Japanese Patent Application 2016-084994 filed Apr. 21, 2016, the entire content of which is incorporated herein by reference.

TECHNICAL FIELD

The present disclosure relates to electronic components, and more particularly, to an electronic component including an inductor.

BACKGROUND

As a disclosure relating to a known electronic component, for example, a filter described in Japanese Unexamined Patent Application Publication No. 2000-13167 has been known. The filter includes a plurality of capacitors, a plurality of inductors, and a substrate. The plurality of capacitors and the plurality of inductors are surface mounted electronic components and are mounted on a main surface of the substrate. Furthermore, a conductive pattern is formed on the main surface of the substrate. Accordingly, the plurality of capacitors and the plurality of inductors are electrically connected to form a filter.

SUMMARY

In the filter described in Japanese Unexamined Patent Application Publication No. 2000-13167, the plurality of capacitors and the plurality of inductors are arranged on the main surface of the substrate. Therefore, the area in which the plurality of capacitors and the plurality of inductors are to be mounted is required for the substrate. Thus, in the case where a plurality of surface mounted electronic components are combined to form an electric circuit such as a filter, the circuit needs to secure a large mounting area.

Accordingly, it is an object of the present disclosure to provide an electronic component with a reduced mounting area.

According to one embodiment of the present disclosure, an electronic component includes a substrate which includes a first main surface and a second main surface each having substantially a rectangular shape; a first outer electrode, a second outer electrode, a third outer electrode, and a fourth outer electrode which are provided on the second main surface to correspond to four corners of the second main surface; a fifth outer electrode which is provided on the second main surface; a multilayer body which includes a third main surface and a fourth main surface, the third main surface being arranged facing the first main surface, and which has a structure in which a plurality of insulating layers are laminated in a normal direction of the first main surface; a first inductor which is provided at the multilayer body, which has substantially a helical shape circulating in a first predetermined direction when viewed from the normal direction, and which includes a first end portion and a second end portion; and a first surface mounted electronic component which is mounted on the fourth main surface and which includes a sixth outer electrode and a seventh outer electrode. The first end portion is electrically connected to the first outer electrode. The second end portion is electrically connected to the second outer electrode and the sixth outer electrode. The seventh outer electrode is electrically connected to the fifth outer electrode. The sixth outer electrode, the seventh outer electrode, and the fifth outer electrode are arranged in a line when viewed from the normal direction. The first surface mounted electronic component does not overlap a center of the first inductor when viewed from the normal direction.

According to another embodiment of the present disclosure, an electronic component includes a substrate which includes a first main surface and a second main surface each having substantially a rectangular shape; a first outer electrode, a second outer electrode, a third outer electrode, and a fourth outer electrode which are provided on the second main surface to correspond to four corners of the second main surface; a fifth outer electrode which is provided on the second main surface; a multilayer body which includes a third main surface and a fourth main surface, the third main surface being arranged facing the first main surface, and which has a structure in which a plurality of insulating layers are laminated in a normal direction of the first main surface; a first inductor which is provided at the multilayer body, which has substantially a helical shape circulating in a first predetermined direction when viewed from the normal direction, and which includes a first end portion and a second end portion; and a first surface mounted electronic component which is mounted on the fourth main surface and which includes a sixth outer electrode and a seventh outer electrode. The first end portion is electrically connected to the first outer electrode. The second end portion is electrically connected to the second outer electrode and the sixth outer electrode. The fifth outer electrode and the seventh outer electrode overlap when viewed from the normal direction. The seventh outer electrode is electrically connected to the fifth outer electrode. The first surface mounted electronic component does not overlap a center of the first inductor when viewed from the normal direction.

According to the embodiment of the present disclosure, a mounting area may be reduced.

Other features, elements, characteristics and advantages of the present disclosure will become more apparent from the following detailed description with reference to the attached drawings.

DETAILED DESCRIPTION (Configuration of Electronic Component)

Figure 1A:
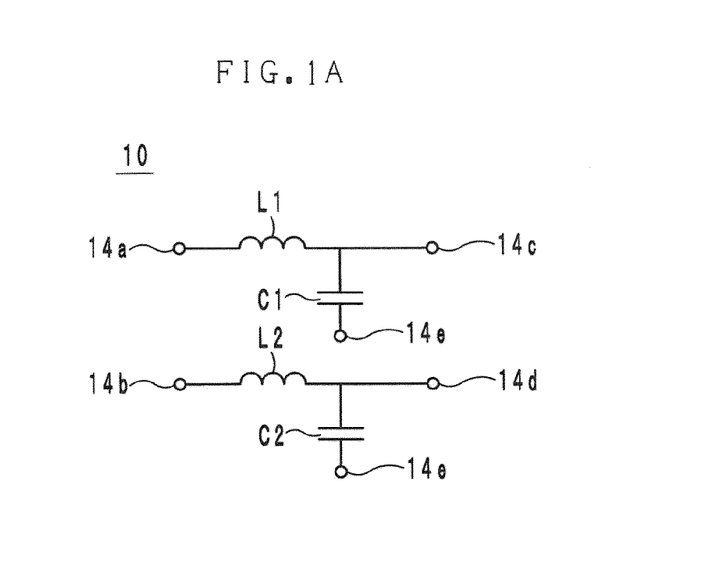
FIG. 1A is an equivalent circuit diagram of an electronic component.
Figure 1B:
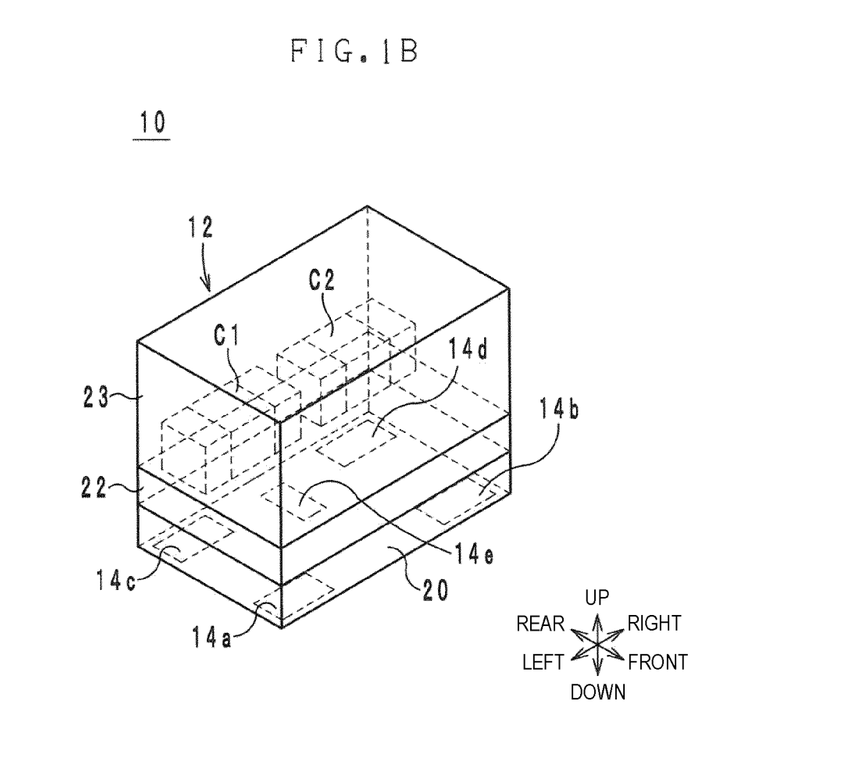
FIG. 1B is an external perspective view of the electronic component.
Figure 2:
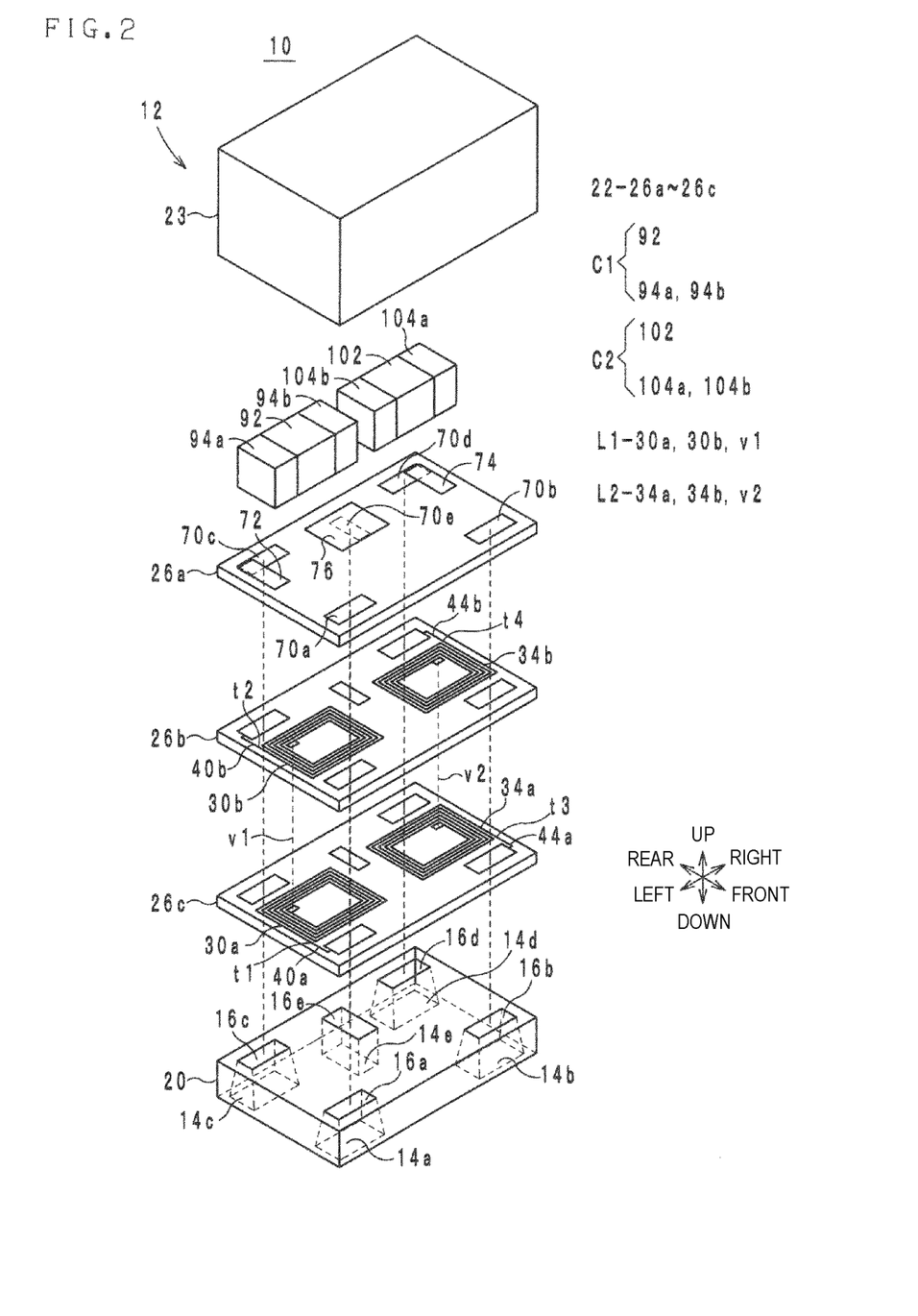
FIG. 2 is an exploded perspective view of the electronic component of FIG. 1B.
Figure 3:
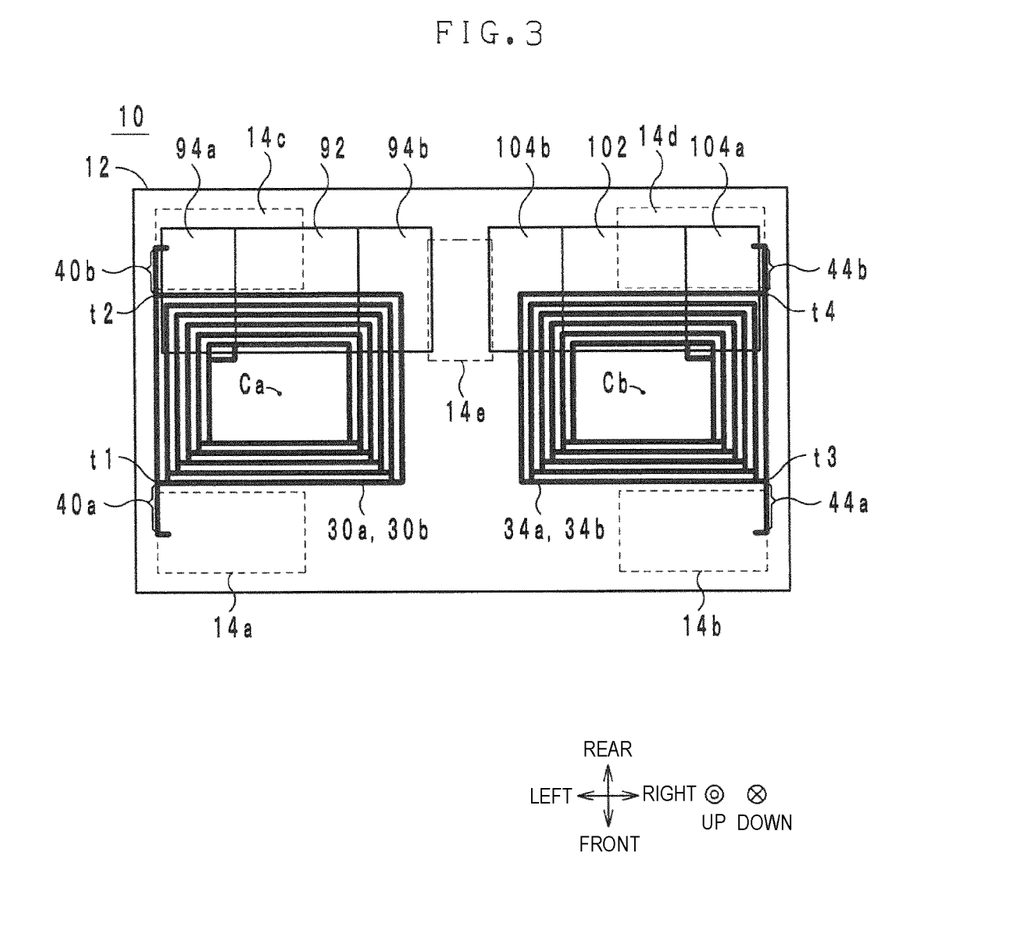
FIG. 3 is a see-through view of the electronic component when the electronic component is viewed from a top side.

First, a configuration of an electronic component 10 according to an embodiment will be described with reference to drawings. FIG. 1A is an equivalent circuit diagram of the electronic component 10. FIG. 1B is an external perspective view of the electronic component 10. FIG. 2 is an exploded perspective view of the electronic component 10 of FIG. 1B. FIG. 3 is a see-through view of the electronic component 10 when the electronic component 10 is viewed from a top side. Hereinafter, the lamination direction of the electronic component 10 is defined as an up-down direction, the direction in which a long side extends when viewed from the top side is defined as a left-right direction, and the direction in which a short side extends when viewed from the top side is defined as a front-rear direction. Furthermore, the up-down direction, the front-end direction, and the left-right direction are orthogonal to one another. The lamination direction is a direction in which insulating layers, which will be described later, are laminated. Furthermore, the up-down direction, the left-right direction, and the front-rear direction referred to when the electronic component 10 is used are not necessarily equal to the up-down direction, the left-right direction, and the front-rear direction defined in FIG. 1B and the like.

The electronic component 10 includes, as illustrated in FIG. 1A, inductors L1 and L2, capacitors C1 and C2, and outer electrodes 14a to 14e. One end of the inductor L1 is connected to the outer electrode 14a. The other end of the inductor L1 is connected to the outer electrode 14c. One electrode of the capacitor C1 is connected to the outer electrode 14c. The other electrode of the capacitor C1 is connected to the outer electrode 14e. Accordingly, the inductor L1 and the capacitor C1 form an L-type low pass filter including an LC series resonator.

One end of the inductor L2 is connected to the outer electrode 14b. The other end of the inductor L2 is connected to the outer electrode 14d. One electrode of the capacitor C2 is connected to the outer electrode 14d. The other electrode of the capacitor C2 is connected to the outer electrode 14e. Accordingly, the inductor L2 and the capacitor C2 form an L-type low pass filter including an LC series resonator. As described above, the electronic component 10 includes two L-type low pass filters.

The electronic component 10 includes, as illustrated in FIG. 1B and FIG. 2, a main body 12, the outer electrodes 14a to 14e, connection parts 16a to 16e, lead conductive layers 40a, 40b, 44a, and 44b, connection conductors 70a to 70e, electrode pads 72, 74, and 76, the inductors L1 and L2, and the capacitors C1 and C2.

The main body 12 has, as illustrated in FIG. 1B and FIG. 2, substantially a rectangular parallelepiped shape, and includes a magnetic substrate 20, a multilayer body 22, and a mold part 23. The mold part 23, the multilayer body 22, and the magnetic substrate 20 are laminated in this order from the top side to the bottom side.

The magnetic substrate 20 is a plate-like member having two main surfaces (an upper surface is an example of a first main surface, and a lower surface is an example of a second main surface) each having substantially a rectangular shape when viewed from the top side. The magnetic substrate 20 is made of a magnetic material. The magnetic substrate 20 is produced by cutting sintered ferrite ceramics. The magnetic substrate 20 may be produced by, for example, applying paste formed by ferrite calcined powder and a binder to a ceramics substrate made of alumina or the like or may be produced by laminating and firing a green sheet made of a ferrite material.

The outer electrodes 14a to 14d are provided on the lower surface of the magnetic substrate 20 such that the outer electrodes 14a to 14d correspond to four corners of the lower surface of the magnetic substrate 20. However, the outer electrodes 14a to 14d only need to be provided at the lower surface of the magnetic substrate 20 and may be embedded in the lower surface. The outer electrodes 14a to 14d each have substantially a rectangular shape when viewed from the bottom side. The outer electrode 14a is provided near the corner on the left front side of the lower surface of the magnetic substrate 20. The outer electrode 14b is provided near the corner on a right front side of the lower surface of the magnetic substrate 20. The outer electrode 14c is provided near the corner on a left rear side of the lower surface of the magnetic substrate 20. The outer electrode 14d is provided near the corner on a right rear side of the lower surface of the magnetic substrate 20. As described above, the outer electrode 14a and the outer electrode 14d are positioned diagonally, and the outer electrode 14b and the outer electrode 14c are positioned diagonally.

The outer electrode 14e (an example of a fifth outer electrode) is provided on the lower surface of the magnetic substrate 20. However, the outer electrode 14e only needs to be provided at the lower surface of the magnetic substrate 20 and may be embedded in the lower surface. The center of the outer electrode 14e does not overlap the intersection of diagonal lines of the magnetic substrate 20 when viewed from the bottom side. The center of the outer electrode 14e is the center of gravity of the outer electrode 14e when the outer electrode 14e is viewed from the bottom side. In this embodiment, the outer electrode 14e has substantially a rectangular shape. Therefore, the center of the outer electrode 14e is the intersection of diagonal lines. Furthermore, in this embodiment, the outer electrode 14e is located backward relative to the intersection of the diagonal lines of the magnetic substrate 20 when viewed from the bottom side.

The outer electrodes 14a to 14e are produced by, for example, laminating an Au film, an Ni film, a Cu film, and a Ti film by a sputtering method. The outer electrodes 14a to 14e may be produced by, for example, printing and baking paste containing metal such as Ag or Cu or may be produced by forming a film of Ag, Cu, or the like by deposition or plating.

The connection parts 16a to 16e are conductors penetrating through the magnetic substrate 20 in the up-down direction. More particularly, four through holes of substantially a rectangular shape are provided near four corners on the upper surface and the lower surface of the magnetic substrate 20 when viewed from the top side. The four through holes overlap the outer electrodes 14a to 14d when viewed from the top side. The connection part 16a is provided at the through hole near the corner on the left front side of the magnetic substrate 20. Accordingly, the lower end of the connection part 16a is connected to the outer electrode 14a. The connection part 16b is provided at the through hole near the corner on the right front side of the magnetic substrate 20. Accordingly, the lower end of the connection part 16b is connected to the outer electrode 14b. The connection part 16c is provided at the through hole near the corner on the left rear side of the magnetic substrate 20. Accordingly, the lower end of the connection part 16c is connected to the outer electrode 14c. The connection part 16d is provided at the through hole near the corner on the right rear side of the magnetic substrate 20. Accordingly, the lower end of the connection part 16d is connected to the outer electrode 14d. The outer electrodes 14a to 14e and the connection parts 16a to 16e may not be separate members but may be a single member. Furthermore, the connection parts 16a to 16e may not have a structure in which the through holes are filled with conductors but may have a structure in which conductive layers are formed on the inner peripheral surface of the through holes.

Furthermore, a through hole is provided on a rear side relative to the intersection of the diagonal lines on the upper surface and the lower surface of the magnetic substrate 20 when viewed from the top side. The through hole overlaps the outer electrode 14e when viewed from the top side. The connection part 16e is provided at the through hole on the rear side relative to the intersection of the diagonal lines on the upper surface and the lower surface. Accordingly, the lower end of the connection part 16e is connected to the outer electrode 14e. The connection parts 16a to 16e are produced by, for example, forming a conductive film containing Cu as a main component by plating. The connection parts 16a to 16e may be produced by, for example, a material with a high electrical conductivity such as Ag or Au.

The multilayer body 22 is a plate-like member including two main surfaces having substantially a rectangular shape when viewed from the top side (an upper surface is an example of a fourth main surface, and a lower surface is an example of a third main surface). The multilayer body 22 is arranged such that the lower surface of the multilayer body 22 faces the upper surface of the magnetic substrate 20. The multilayer body 22 includes insulating layers 26a to 26c (an example of a plurality of insulating layers).

The insulating layers 26a to 26c are laminated in this order from the top side to the bottom side (an example of a normal direction of the first main surface) and has substantially a rectangular shape when viewed from the top side. The insulating layers 26a to 26c contain insulating resin as a material, and is made of polyimide in this embodiment. Therefore, the insulating layers 26a to 26c are made of a nonmagnetic material. However, the insulating layer 26a, which is the uppermost layer, may be made of a magnetic material. Furthermore, the insulating layers 26a to 26c may be produced from, for example, an insulating resin such as benzocyclobutene.

The inductor L1 (an example of a first inductor) is provided within the multilayer body 22, and includes inductor conductive layers 30a and 30b (an example of one or more first inductor conductive layers) and an interlayer connection conductor v1. The inductor L1 includes end portions t1 and t2 (the end portion t1 is an example of a first end portion, and the end portion t2 is an example of a second end portion), and the inductor L1 has substantially a helical shape circulating in the clockwise direction (an example of a first predetermined direction) from the end portion t1 toward the end portion t2.

The inductor conductive layer 30a (an example of a second inductor conductive layer) is provided on the upper surface of the insulating layer 26c, and has substantially a spiral shape extending from an outer peripheral side toward an inner peripheral side while circulating in the clockwise direction when viewed from the top side. The inductor conductive layer 30a has a length of about six turns. Furthermore, the inductor conductive layer 30a is provided in a left half region of the insulating layer 26c and has substantially a rectangular outer shape when viewed from the top side.

The inductor conductive layer 30b (an example of a third inductor conductive layer) is provided on the upper surface of the insulating layer 26b, and has substantially a spiral shape extending from an inner peripheral side toward an outer peripheral side while circulating in the clockwise direction when viewed from the top side. The inductor conductive layer 30b has a length of about six turns. Furthermore, the inductor conductive layer 30b is provided in a left half region of the insulating layer 26b and has substantially a rectangular outer shape when viewed from the top side. Furthermore, the inductor conductive layer 30a and the inductor conductive layer 30b overlap when viewed from the top side.

The interlayer connection conductor v1 penetrates through the insulating layer 26b in the up-down direction, and allows connection between an end portion on the inner peripheral side of the inductor conductive layer 30a and an end portion on the inner peripheral side of the inductor conductive layer 30b. Accordingly, the inductor conductive layer 30a and the inductor conductive layer 30b are electrically connected in series. Furthermore, the end portion t1 of the inductor L1 is an end portion on the outer peripheral side of the inductor conductive layer 30a. The end portion t2 of the inductor L1 is an end portion on the outer peripheral side of the inductor conductive layer 30b.

The connection conductor 70a is a conductor of substantially a quadrangular prism shape provided at the corner on a left front side of the insulating layers 26a to 26c. For easier understanding, in FIG. 2, the connection conductor 70a is described as being divided into three. Similar to the connection conductor 70a, connection conductors 70b to 70e, which will be described later, are also described as being divided into three. The connection conductor 70a extends in the up-down direction from the upper surface of the insulating layer 26a to the lower surface of the insulating layer 26c. The lower end of the connection conductor 70a is connected to the connection part 16a.

The lead conductive layer 40a is provided on the upper surface of the insulating layer 26c, and allows connection between the end portion on the outer peripheral side of the inductor conductive layer 30a and the connection conductor 70a. The lead conductive layer 40a does not have substantially a spiral shape when viewed from the top side, and extends forward from the end portion on the outer peripheral side of the inductor conductive layer 30a. As illustrated in FIG. 3, the border between the inductor conductive layer 30a and the lead conductive layer 40a is at a position where the lead conductive layer 40a is separated from the locus of substantially the spiral shape of the inductor conductive layer 30a. Accordingly, the end portion on the outer peripheral side of the inductor conductive layer 30a (that is, the end portion t1) and the outer electrode 14a (an example of a first outer electrode) are electrically connected with the lead conductive layer 40a, the connection conductor 70a, and the connection part 16a interposed therebetween.

The electrode pad 72 is provided on the upper surface of the insulating layer 26a, and has substantially a rectangular shape when viewed from the top side. In this embodiment, the electrode pad 72 is provided near the corner on the left rear side of the insulating layer 26a when viewed from the top side.

The connection conductor 70c is a conductor of substantially a quadrangular prism shape provided at the corner on a left rear side of the insulating layers 26a to 26c. The connection conductor 70c extends in the up-down direction from the upper surface of the insulating layer 26a to the lower surface of the insulating layer 26c. The upper end of the connection conductor 70c is connected to the electrode pad 72. The lower end of the connection conductor 70c is connected to the connection part 16c. Accordingly, the outer electrode 14c and the electrode pad 72 are electrically connected with the connection conductor 70c and the connection part 16c interposed therebetween.

The lead conductive layer 40b is provided on the upper surface of the insulating layer 26b, and allows connection between an end portion on the outer peripheral side of the inductor conductive layer 30b and the connection conductor 70c. The lead conductive layer 40b does not have substantially a spiral shape when viewed from the top side, and extends backward from the end portion on the outer peripheral side of the inductor conductive layer 30b. As illustrated in FIG. 3, the border between the inductor conductive layer 30b and the lead conductive layer 40b is at a position where the lead conductive layer 40b is separated from the locus of substantially the spiral shape of the inductor conductive layer 30b. Accordingly, the end portion on the outer peripheral side of the inductor conductive layer 30b (that is, the end portion t2) and the outer electrode 14c (an example of a second outer electrode) are electrically connected with the lead conductive layer 40b, the connection conductor 70c, and the connection part 16c interposed therebetween.

The electrode pad 76 is provided on the upper surface of the insulating layer 26a, and has substantially a rectangular shape when viewed from the top side. In this embodiment, the electrode pad 76 is provided on a rear side relative to the intersection of the diagonal lines of the insulating layer 26a when viewed from the top side.

The connection conductor 70e is a conductor of substantially a quadrangular prism shape provided on a rear side relative to the intersection of the diagonal lines of the insulating layers 26a to 26c when viewed from the top side. The connection conductor 70e extends in the up-down direction from the upper surface of the insulating layer 26a to the lower surface of the insulating layer 26c. The upper end of the connection conductor 70e is connected to the electrode pad 76. The lower end of the connection conductor 70e is connected to the connection part 16e. Accordingly, the outer electrode 14e and the electrode pad 76 are electrically connected with the connection conductor 70e and the connection part 16e interposed therebetween.

The capacitor C1 (an example of a first surface mounted electronic component) is a multilayer chip component, and includes a main body 92 and outer electrodes 94a and 94b (the outer electrode 94a is an example of a sixth outer electrode, and the outer electrode 94b is an example of a seventh outer electrode). The main body 92 has a structure in which a plurality of insulating layers and capacitor conductive layers are laminated, and has substantially a rectangular parallelepiped shape. The insulating layers are made of, for example, dielectric ceramics. The capacitor conductive layers are made from, for example, conductors containing Ag as a main component. The internal structure of the capacitor C1 is a general structure, and therefore, explanation for the internal structure of the capacitor C1 will be omitted.

The outer electrode 94a covers the entire left surface of the main body 92, and is folded onto the upper surface, lower surface, front surface, and rear surface of the main body 92. The outer electrode 94b covers the entire right surface of the main body 92, and is folded onto the upper surface, lower surface, front surface, and rear surface of the main body 92. For example, the outer electrodes 94a and 94b may be produced by printing and baking paste containing metal such as Ag or Cu or may be produced by forming a film of Ag, Cu, or the like by deposition or plating.

The capacitor C1 is mounted on the upper surface of the multilayer body 22. The outer electrode 94a is mounted on the electrode pad 72 by soldering. Accordingly, the outer electrode 94a and the end portion t2 of the inductor L1 are electrically connected with the electrode pad 72, the connection conductor 70c, and the lead conductive layer 40b interposed therebetween.

Furthermore, the outer electrode 94b is mounted on the electrode pad 76 by soldering. Accordingly, the outer electrode 14e and the outer electrode 94b are electrically connected with the electrode pad 76, the connection conductor 70e, and the connection part 16e interposed therebetween.

Furthermore, the electrode pad 72 and the electrode pad 76 are arranged with a space therebetween along the long side on the rear side of the insulating layer 26a when viewed from the top side. Therefore, the capacitor C1 is also located near the long side on the rear side of the insulating layer 26a when viewed from the top side. Accordingly, the capacitor C1 does not overlap the center Ca of the inductor L1 when viewed from the top side. The center Ca of the inductor L1 is the center of circulation of the inductor conductive layers 30a and 30b each having substantially a spiral shape. However, the capacitor C1 overlaps a side on the rear side of the inductor conductive layers 30a and 30b each having a substantially rectangular outer shape when viewed from the top side.

Furthermore, the outer electrode 14e is located near the center of the long side on the rear side of the lower surface of the magnetic substrate 20 when viewed from the top side. Furthermore, as described above, the electrode pad 72 and the electrode pad 76 are arranged with a space therebetween along the long side on the rear side of the insulating layer 26a when viewed from the top side. Therefore, the outer electrode 94a mounted on the electrode pad 72 and the outer electrode 94b mounted on the electrode pad 76 are also arranged with a space therebetween along the long side on the rear side of the insulating layer 26a. Consequently, the outer electrode 94a, the outer electrode 94b, and the outer electrode 14e are arranged in a line in this order from the left side to the right side.

Furthermore, the outer electrode 14e and the electrode pad 76 are electrically connected with the connection conductor 70e and the connection part 16e, which extend in the up-down direction, interposed therebetween. Therefore, the outer electrode 14e and the electrode pad 76 overlap when viewed from the top side. Furthermore, the outer electrode 94b is mounted on the electrode pad 76. Therefore, the outer electrode 14e and the outer electrode 94b overlap when viewed from the top side.

The inductor L2 (an example of a second inductor) is provided within the multilayer body 22, and includes inductor conductive layers 34a and 34b and an interlayer connection conductor v2. The inductor L2 includes end portions t3 and t4 (the end portion t3 is an example of a third end portion, and the end portion t4 is an example of a fourth end portion), and the inductor L2 has substantially a helical shape circulating in the counterclockwise direction (an example of a second predetermined direction) from the end portion t3 toward the end portion t4.

The inductor conductive layer 34a is provided on the upper surface of the insulating layer 26c, and has substantially a spiral shape extending from the outer peripheral side toward the inner peripheral side while circulating in the counterclockwise direction when viewed from the top side. The inductor conductive layer 34a has a length of about six turns. Furthermore, the inductor conductive layer 34a is provided in a right half region of the insulating layer 26c and has substantially a rectangular outer shape when viewed from the top side.

The inductor conductive layer 34b is provided on the upper surface of the insulating layer 26b, and has substantially a spiral shape extending from the inner peripheral side toward the outer peripheral side while circulating in the counterclockwise direction when viewed from the top side. The inductor conductive layer 34b has a length of about six turns. Furthermore, the inductor conductive layer 34b is provided in a right half region of the insulating layer 26b and has substantially a rectangular outer shape when viewed from the top side. Furthermore, the inductor conductive layer 34a and the inductor conductive layer 34b overlap when viewed from the top side.

The interlayer connection conductor v2 penetrates through the insulating layer 26b in the up-down direction, and allows connection between an end portion on the inner peripheral side of the inductor conductive layer 34a and an end portion on the inner peripheral side of the inductor conductive layer 34b. Accordingly, the inductor conductive layer 34a and the inductor conductive layer 34b are electrically connected in series. Furthermore, the end portion t3 of the inductor L2 is an end portion on the outer peripheral side of the inductor conductive layer 34a. The end portion t4 of the inductor L2 is an end portion on the outer peripheral side of the inductor conductive layer 34b.

The connection conductor 70b is a conductor of substantially a quadrangular prism shape provided at the corner on a right front side of the insulating layers 26a to 26c. The connection conductor 70b extends in the up-down direction from the upper surface of the insulating layer 26a to the lower surface of the insulating layer 26c. The lower end of the connection conductor 70b is connected to the connection part 16b.

The lead conductive layer 44a is provided on the upper surface of the insulating layer 26c, and allows connection between the end portion on the outer peripheral side of the inductor conductive layer 34a and the connection conductor 70b. The lead conductive layer 44a does not have substantially a spiral shape when viewed from the top side, and extends forwards from the end portion on the outer peripheral side of the inductor conductive layer 34a. The border between the inductor conductive layer 34a and the lead conductive layer 44a is at the position where the lead conductive layer 44a is separated from the locus of substantially the spiral shape of the inductor conductive layer 34a, as illustrated in FIG. 3. Accordingly, the end portion on the outer peripheral side of the inductor conductive layer 34a (that is, the end portion t3) and the outer electrode 14b (an example of a third outer electrode) are electrically connected with the lead conductive layer 44a, the connection conductor 70b, and the connection part 16b interposed therebetween.

The electrode pad 74 is provided on the upper surface of the insulating layer 26a, and has substantially a rectangular shape when viewed from the top side. In this embodiment, the electrode pad 74 is provided near the corner on a right rear side of the insulating layer 26a when viewed from the top side.

The connection conductor 70d is a conductor of substantially a quadrangular prism shape provided near the corner on a right rear side of the insulating layers 26a to 26c. The connection conductor 70d extends in the up-down direction from the upper surface of the insulating layer 26a to the lower surface of the insulating layer 26c. The upper end of the connection conductor 70d is connected to the electrode pad 74. The lower end of the connection conductor 70d is connected to the connection part 16d. Accordingly, the outer electrode 14d and the electrode pad 74 are electrically connected with the connection conductor 70d and the connection part 16d interposed therebetween.

The lead conductive layer 44b is provided on the upper surface of the insulating layer 26b, and allows connection between the end portion on the outer peripheral side of the inductor conductive layer 34b and the connection conductor 70d. The lead conductive layer 44b does not have substantially a spiral shape when viewed from the top side, and extends backwards from the end portion on the outer peripheral side of the inductor conductive layer 34b. The border between the inductor conductive layer 34b and the lead conductive layer 44b is at the position where the lead conductive layer 44b is separated from the locus of substantially the spiral shape of the inductor conductive layer 34b, as illustrated in FIG. 3. Accordingly, the end portion on the outer peripheral side of the inductor conductive layer 34b (that is, the end portion t4) and the outer electrode 14d (an example of a fourth outer electrode) are electrically connected with the lead conductive layer 44b, the connection conductor 70d, and the connection part 16d interposed therebetween.

The capacitor C2 (an example of a second surface mounted electronic component) is a multilayer chip component, and includes a main body 102 and outer electrodes 104a and 104b (the outer electrode 104a is an example of an eighth outer electrode, and the outer electrode 104b is an example of a ninth outer electrode). The main body 102 has a structure in which a plurality of insulating layers and capacitor conductive layers are laminated, and has substantially a rectangular parallelepiped shape. The insulating layers are made of, for example, dielectric ceramics. The capacitor conductive layers are made from, for example, conductors containing Ag as a main component. The internal structure of the capacitor C2 is a general structure, and therefore, explanation for the internal structure of the capacitor C2 will be omitted.

The outer electrode 104a covers the entire right surface of the main body 102, and is folded onto the upper surface, lower surface, front surface, and rear surface of the main body 102. The outer electrode 104b covers the entire left surface of the main body 102, and is folded onto the upper surface, lower surface, front surface, and rear surface of the main body 102. For example, the outer electrodes 104a and 104b may be produced by printing and baking paste containing metal such as Ag or Cu or may be produced by forming a film of Ag, Cu, or the like by deposition or plating.

The capacitor C2 is mounted on the upper surface of the multilayer body 22. The outer electrode 104a is mounted on the electrode pad 74 by soldering. Accordingly, the outer electrode 104a and the end portion t4 of the inductor L2 are electrically connected with the electrode pad 74, the connection conductor 70d, and the lead conductive layer 44b interposed therebetween.

Furthermore, the outer electrode 104b is mounted on the electrode pad 76 by soldering. Accordingly, the outer electrode 14e and the outer electrode 104b are electrically connected with the electrode pad 76, the connection conductor 70e, and the connection part 16e interposed therebetween.

Furthermore, the electrode pad 74 and the electrode pad 76 are arranged with a space therebetween along a long side on the rear side of the insulating layer 26a when viewed from the top side. Therefore, the capacitor C2 is also located near the long side on the rear side of the insulating layer 26a when viewed from the top side. Accordingly, the capacitor C2 does not overlap the center Cb of the inductor L2 when viewed from the top side. The center Cb of the inductor L2 is the center of circulation of the inductor conductive layers 34a and 34b each having substantially a spiral shape. However, the capacitor C2 overlaps a side on the rear side of the inductor conductive layers 34a and 34b each having substantially a rectangular outer shape when viewed from the top side.

Furthermore, the outer electrode 14e is located near the center of the long side on the rear side of the magnetic substrate 20 when viewed from the top side. Furthermore, as described above, the electrode pad 74 and the electrode pad 76 are arranged with a space therebetween along the long side on the rear side of the insulating layer 26a when viewed from the top side. Therefore, the outer electrode 104a mounted on the electrode pad 74 and the outer electrode 104b mounted on the electrode pad 76 are also arranged with a space therebetween along the long side on the rear side of the insulating layer 26a. Consequently, the outer electrode 104a, the outer electrode 104b, and the outer electrode 14e are arranged in a line in this order from the right side to the left side.

Furthermore, the outer electrode 14e and the electrode pad 76 are electrically connected with the connection conductor 70e and the connection part 16e, which extends in the up-down direction, interposed therebetween. Therefore, the outer electrode 14e and the electrode pad 76 overlap when viewed from the top side. Furthermore, the outer electrode 104b is mounted on the electrode pad 76. Therefore, the outer electrode 14e and the outer electrode 104b overlap when viewed from the top side.

The mold part 23 is provided on the upper surface of the multilayer body 22, and has substantially a rectangular parallelepiped shape. The mold part 23 is a resin member which covers the capacitors C1 and C2. The mold part 23 is made of, for example, an epoxy resin. The mold part 23 covers the upper surface of the multilayer body 22, so that the electronic component 10 has substantially a rectangular parallelepiped shape. In the electronic component 10, the multilayer body 22 represents elements up to the insulating layer 26a on which the capacitor C1 and the capacitor C2 are mounted. Therefore, the multilayer body 22 does not include an insulating layer which is above the insulating layer 26a. Thus, the mold part 23 is a member separated from the multilayer body 22, and is not part of the multilayer body 22.

In the electronic component 10 configured as described above, the outer electrodes 14a and 14b are used as input terminals. Furthermore, the outer electrodes 14c and 14d are used as output terminals. The outer electrode 14e is used as a ground terminal (that is, connected to the ground). However, the outer electrodes 14a and 14b may be used as output terminals, and the outer electrodes 14c and 14d may be used as input terminals. Furthermore, the outer electrode 14e may be used for an application different from a ground terminal.

(Manufacturing Method for Electronic Component)

A manufacturing method for the electronic component 10 will be described below. A case where one electronic component is manufactured will be described below as an example. However, in actuality, multiple electronic components 10 are formed at the same time by laminating a large-sized mother magnetic substrate and mother insulating layer to produce a mother body and cutting the mother body.

First, a polyimide resin, which is a photosensitive resin, is applied to the entire upper surface of the magnetic substrate 20. Next, positions of the insulating layer 26c that correspond to the connection conductors 70a to 70e are light-shielded, and light exposure is performed. Accordingly, a portion of the polyimide resin that is not light-shielded is solidified. After that, a photoresist is removed by an organic solvent, and development is performed, so that unsolidified polyimide resin is removed and thermosetting is performed. Thus, the insulating layer 26c is formed.

Next, an Ag film is formed on the insulating layer 26c and the magnetic substrate 20 which is exposed from the insulating layer 26c by sputtering. Next, a photoresist is formed on a portion in which the inductor conductive layers 30a and 34a, the lead conductive layers 40a and 44a, and the connection conductors 70a to 70d are formed. Then, by etching, portions of the Ag film other than the portion in which the inductor conductive layers 30a and 34a, the lead conductive layers 40a and 44a, and the connection conductors 70a to 70d are formed (that is, a portion covered with the photoresist) are removed. After that, by removing the photoresist using the organic solvent, part of the inductor conductive layers 30a and 34a, the lead conductive layers 40a and 44a, and the connection conductors 70a to 70d (for one layer) are formed.

By repeating the above steps and similar steps, the insulating layers 26a and 26b, the inductor conductive layers 30b and 34b, the lead conductive layers 40b and 44b, the rest part of the connection conductors 70a to 70e, the electrode pads 72, 74, and 76, and the interlayer connection conductors v1 and v2 are formed.

Next, by combination of electrolytic plating and photolithography, a conductive layer is formed on the inner peripheral surface of cutouts of the magnetic substrate 20, and the connection parts 16a to 16e and the outer electrodes 14a to 14e are thus formed.

Next, the capacitors C1 and C2 are formed on the electrode pads 72, 74, and 76. The capacitors C1 and C2 may be mounted by, for example, soldering or using a conductive adhesive.

Finally, the upper surface of the multilayer body 22 is sealed with a resin, and the mold part 23 is thus formed. With the above steps, manufacturing of the electronic component 10 is completed.

(Effects)

With the electronic component 10 having the above configuration, the mounting area may be reduced. More particularly, in the filter described in Japanese Unexamined Patent Application Publication No. 2000-13167, a plurality of capacitors and a plurality of inductors are arranged on the main surface of the substrate. Therefore, an area in which the plurality of capacitors and the plurality of inductors are to be mounted is required for the substrate. Therefore, in the case where a plurality of surface mounted electronic components are combined to form an electric circuit such as a filter, the circuit needs to secure a large mounting area.

Thus, the capacitors C1 and C2 are provided within the electronic component 10. Accordingly, the capacitors C1 and C2 and the inductors L1 and L2 are close to each other in the front-rear direction and the left-right direction. Consequently, the mounting area of the electronic component 10 may be reduced.

Furthermore, in the electronic component 10, parasitic inductance and resistance generated between the capacitor C1 and the outer electrode 14e may be reduced. More particularly, the outer electrode 94b of the capacitor C1 is electrically connected to the outer electrode 14e. The outer electrode 94a and the outer electrode 94b of the capacitor C1 and the outer electrode 14e are arranged in a line when viewed from the top side. That is, the outer electrode 14e is located on extension of a line connecting the outer electrode 94a to the outer electrode 94b when viewed from the top side. Accordingly, by providing a conductive layer (the electrode pad 76) extending linearly from the outer electrode 94b to the portion immediately above the outer electrode 14e and providing a conductor (the connection conductor 70e and the connection part 16e) extending from the conductive layer to the right below thereof, the outer electrode 94b and the outer electrode 14e may be electrically connected. That is, the length of a conductor which allows connection between the outer electrode 94b and the outer electrode 14e is shortened. Consequently, in the electronic component 10, parasitic inductance and resistance generated between the capacitor C1 and the outer electrode 14e may be reduced.

For the same reason, parasitic inductance and resistance generated between the capacitor C2 and the outer electrode 14e may be reduced.

Furthermore, in the electronic component 10, the outer electrode 14e and the outer electrode 94b overlap when viewed from the top side. Accordingly, the length of a conductor for allowing connection between the outer electrode 14e and the outer electrode 94b is further shortened. Consequently, in the electronic component 10, parasitic inductance and resistance generated between the capacitor C1 and the outer electrode 14e may further be reduced. For the same reason, parasitic inductance and resistance generated between the capacitor C2 and the outer electrode 14e may further be reduced.

As described above, reducing the parasitic inductance between capacitor C1 and the outer electrode 14e effectively reduces noise in the case where the electronic component 10 is used as a noise filter. More particularly, as the electronic component 10, an electronic component in which parasitic inductance is generated between the capacitor C1 and the outer electrode 14e will be explained as a comparative example. Parts common in the configuration of the electronic component according to the comparative example and the configuration of the electronic component 10 will be referred to with the same reference signs.

As an electronic component according to the comparative example, for example, an electronic component in which the center of the outer electrode 14e overlaps the intersection of diagonal lines on the lower surface of the magnetic substrate 20 when viewed from the top side is used. In this case, the electrode pad 76 also needs to overlap the intersection of the diagonal lines on the lower surface of the magnetic substrate 20 when viewed from the top side. That is, the length of the electrode pad 76 in the front-rear direction is increased. Accordingly, parasitic inductance is generated between the capacitor C1 and the outer electrode 14e.

When parasitic inductance is generated between the capacitor C1 and the outer electrode 14e, an inductance component of the LC series resonator formed by the inductor L1 and the capacitor C1 increases. Therefore, the resonant frequency of the LC series resonator is reduced, and the position of an attenuation pole is shifted toward a lower frequency side relative to a target value. As a result, in the electronic component according to the comparative example, desired bandpass characteristics may not be achieved.

Thus, in the electronic component 10, generation of parasitic inductance is reduced. Accordingly, deviation of the resonant frequency of the LC series resonator from the target value may be suppressed. As a result, the electronic component 10 may achieve desired bandpass characteristics and reduce noise effectively. Due to suppression of parasitic inductance between the capacitor C2 and the outer electrode 14e, the electronic component 10 may also achieve desired bandpass characteristics and reduce noise effectively.

Furthermore, by reducing the resistance between the capacitor C1 and the outer electrode 14e, in the case where the electronic component 10 is used as a noise filter, noise may be reduced effectively. More particularly, as the electronic component 10, an electronic component in which resistance is generated between the capacitor C1 and the outer electrode 14e will be explained as a comparative example. Parts common in the configuration of the electronic component according to the comparative example and the configuration of the electronic component 10 will be referred to with the same reference signs.

As an electronic component according to the comparative example, for example, an electronic component in which the center of the outer electrode 14e overlaps the intersection of diagonal lines of the lower surface of the magnetic substrate 20 when viewed from the top side is used. In this case, the electrode pad 76 also needs to overlap the intersection of the diagonal lines of the lower surface of the magnetic substrate 20 when viewed from the top side. That is, the length of the electrode pad 76 in the front-rear direction increases. Accordingly, resistance is generated between the capacitor C1 and the outer electrode 14e.

Generation of resistance between the capacitor C1 and the outer electrode 14e makes it hard for noise to be delivered to the outer electrode 14e. Therefore, part of the noise is output from the outer electrode 14c.

Thus, in the electronic component 10, generation of resistance between the capacitor C1 and the outer electrode 14e is suppressed. Accordingly, noise is output from the outer electrode 14e, and thus output of noise from the outer electrode 14c is suppressed. As a result, the electronic component 10 effectively reduces noise. Due to suppression of resistance between the capacitor C2 and the outer electrode 14e, the electronic component 10 may also reduce noise effectively.

Furthermore, in the electronic component 10, the capacitors C1 and C2 do not overlap the centers Ca and Cb of the inductors L1 and L2, respectively, when viewed from the top side. Therefore, magnetic flux generated at the inductors L1 and L2 passing through the capacitors C1 and C2 is suppressed, and generation of eddy current is suppressed. Consequently, the Q value of the inductors L1 and L2 is improved.

Furthermore, in the electronic component 10, both the outer electrode 94b of the capacitor C1 and the outer electrode 104b of the capacitor C2 are connected to the electrode pad 76. Accordingly, in the electronic component 10, compared to a case where an electrode pad to which the outer electrode 94b is connected and an electrode pad to which the outer electrode 104b is connected are provided separately, the size of elements may be reduced.

(Other Embodiments)

An electronic component according to the present disclosure may be changed within the scope of the present disclosure, without being limited to the electronic component 10.

In the electronic component 10, substantially a helical shape represents both a two-dimensional helical shape (that is, spiral) and a three-dimensional helical shape (that is, helix). Therefore, in the electronic component 10, the inductors L1 and L2 may each have substantially a helix shape extending in the up-down direction while circulating.

The outer electrodes 94b and 104b and the outer electrode 14e may not overlap when viewed from the top side.

In the electronic component 10, the inductor L2 or the capacitor C2 may not be provided. In this case, the outer electrodes 14b and 14d are, for example, dummy electrodes which are not used for input and output of signals or connection to the ground. Furthermore, in the case where, in place of the inductor L2 and the capacitor C2, a different circuit element is connected between the outer electrode 14b and the outer electrode 14d, the outer electrodes 14b and 14d are used for input and output of signals and connection to the ground.

In the electronic component 10, a chip component such as a resistor may be mounted in place of the capacitors C1 and C2.

Furthermore, in the electronic component 10, a surface mounted electronic component may be mounted on the electrode pads 72, 74, and 76. The surface mounted electronic component represents an electronic component mounted on a surface of a substrate by soldering or the like, and may be a chip component. For example, a surface mounted electronic component such as a winding coil may be used as a surface mounted electronic component different from a chip component.

In the electronic component 10, the inductor conductive layer 30b may not be provided. In this case, the end portion on the inner peripheral side of the inductor conductive layer 30a and the electrode pad 72 may be electrically connected with the interlayer connection conductor v1 interposed therebetween. However, to suppress overlapping of a region surrounded by the inductor conductive layer 30a (inner magnetic path) and the capacitor C1 when viewed from the top side, it is preferable that the end portion on the inner peripheral side of the inductor conductive layer 30a is positioned near the rear end of the inner magnetic path of the inductor conductive layer 30a when viewed from the top side.

In the electronic component 10, an electrode pad to which the outer electrode 94b is connected and an electrode pad to which the outer electrode 104b is connected may be provided separately.

As described above, the present disclosure is useful for an electronic component, and more particularly, is excellent in reducing a mounting area.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. An electronic component comprising:
    a substrate which includes a first main surface and a second main surface each having substantially a rectangular shape;
    a first outer electrode, a second outer electrode, a third outer electrode, and a fourth outer electrode which are provided on the second main surface to correspond to four corners of the second main surface;
    a fifth outer electrode which is provided on the second main surface;
    a multilayer body which includes a third main surface and a fourth main surface, the third main surface being arranged facing the first main surface, and which has a structure in which a plurality of insulating layers are laminated in a normal direction of the first main surface;
    a first inductor which is provided at the multilayer body, which has substantially a helical shape circulating in a first predetermined direction when viewed from the normal direction, and which includes a first end portion and a second end portion; and
    a first surface mounted electronic component which is mounted on the fourth main surface and which includes a sixth outer electrode and a seventh outer electrode,
    wherein the first end portion is electrically connected to the first outer electrode,
    wherein the second end portion is electrically connected to the second outer electrode and the sixth outer electrode,
    wherein the seventh outer electrode is electrically connected to the fifth outer electrode,
    wherein the sixth outer electrode, the seventh outer electrode, and the fifth outer electrode are arranged in a line when viewed from the normal direction, and
    wherein the first surface mounted electronic component does not overlap a center of the first inductor when viewed from the normal direction.

2. The electronic component according to claim 1, wherein a center of the fifth outer electrode does not overlap an intersection of diagonal lines on the second main surface.

3. The electronic component according to claim 1, wherein the fifth outer electrode is connected to ground.

4. The electronic component according to claim 1, wherein the first inductor includes one or more first inductor conductive layers each having substantially a spiral shape when viewed from the normal direction.

5. The electronic component according to claim 4, wherein the one or more first inductor conductive layers include one or more second inductor conductive layers extending from an outer peripheral side toward an inner peripheral side while circulating in the first predetermined direction when viewed from the normal direction and one or more third inductor conductive layers extending from an inner peripheral side toward an outer peripheral side while circulating in the first predetermined direction when viewed from the normal direction,
wherein an end portion on an inner peripheral side of one of the second inductor conductive layers and an end portion on an inner peripheral side of one of the third inductor conductive layers are electrically connected,
wherein the first end portion is an end portion on an outer peripheral side of one of the second inductor conductive layers, and
wherein the second end portion is an end portion on an outer peripheral side of one of the third inductor conductive layers.

6. The electronic component according to claim 1, further comprising:
    a second inductor which is provided at the multilayer body, which has substantially a helical shape circulating in a second predetermined direction when viewed from the normal direction, and which includes a third end portion and a fourth end portion; and
    a second surface mounted electronic component which is mounted on the fourth main surface and which includes an eighth outer electrode and a ninth outer electrode,
    wherein the first outer electrode and the fourth outer electrode are positioned diagonally, and the second outer electrode and the third outer electrode are positioned diagonally,
    wherein the third end portion is electrically connected to the third outer electrode,
    wherein the fourth end portion is electrically connected to the fourth outer electrode and the eighth outer electrode,
    wherein the ninth outer electrode is electrically connected to the fifth outer electrode,
    wherein the eighth outer electrode, the ninth outer electrode, and the fifth outer electrode are arranged in a line, and
    wherein the second surface mounted electronic component does not overlap a center of the second inductor when viewed from the normal direction.

7. An electronic component comprising:
a substrate which includes a first main surface and a second main surface each having substantially a rectangular shape;
a first outer electrode, a second outer electrode, a third outer electrode, and a fourth outer electrode which are provided on the second main surface to correspond to four corners of the second main surface;
a fifth outer electrode which is provided on the second main surface;
a multilayer body which includes a third main surface and a fourth main surface, the third main surface being arranged facing the first main surface, and which has a structure in which a plurality of insulating layers are laminated in a normal direction of the first main surface;
a first inductor which is provided at the multilayer body, which has substantially a helical shape circulating in a first predetermined direction when viewed from the normal direction, and which includes a first end portion and a second end portion; and
a first surface mounted electronic component which is mounted on the fourth main surface and which includes a sixth outer electrode and a seventh outer electrode,
wherein the first end portion is electrically connected to the first outer electrode,
wherein the second end portion is electrically connected to the second outer electrode and the sixth outer electrode,
wherein the fifth outer electrode and the seventh outer electrode overlap when viewed from the normal direction,
wherein the seventh outer electrode is electrically connected to the fifth outer electrode, and
wherein the first surface mounted electronic component does not overlap a center of the first inductor when viewed from the normal direction.

8. The electronic component according to claim 7, wherein a center of the fifth outer electrode does not overlap an intersection of diagonal lines on the second main surface.

9. The electronic component according to claim 7, wherein the fifth outer electrode is connected to ground.

10. The electronic component according to claim 7, wherein the first inductor includes one or more first inductor conductive layers each having substantially a spiral shape when viewed from the normal direction.

11. The electronic component according to claim 10, wherein the one or more first inductor conductive layers include one or more second inductor conductive layers extending from an outer peripheral side toward an inner peripheral side while circulating in the first predetermined direction when viewed from the normal direction and one or more third inductor conductive layers extending from an inner peripheral side toward an outer peripheral side while circulating in the first predetermined direction when viewed from the normal direction,
wherein an end portion on an inner peripheral side of one of the second inductor conductive layers and an end portion on an inner peripheral side of one of the third inductor conductive layers are electrically connected,
wherein the first end portion is an end portion on an outer peripheral side of one of the second inductor conductive layers, and
wherein the second end portion is an end portion on an outer peripheral side of one of the third inductor conductive layers.

12. The electronic component according to claim 7, further comprising:
a second inductor which is provided at the multilayer body, which has substantially a helical shape circulating in a second predetermined direction when viewed from the normal direction, and which includes a third end portion and a fourth end portion; and
a second surface mounted electronic component which is mounted on the fourth main surface and which includes an eighth outer electrode and a ninth outer electrode,
wherein the first outer electrode and the fourth outer electrode are positioned diagonally, and the second outer electrode and the third outer electrode are positioned diagonally,
wherein the third end portion is electrically connected to the third outer electrode,
wherein the fourth end portion is electrically connected to the fourth outer electrode and the eighth outer electrode,
wherein the ninth outer electrode is electrically connected to the fifth outer electrode,
wherein the eighth outer electrode, the ninth outer electrode, and the fifth outer electrode are arranged in a line, and
wherein the second surface mounted electronic component does not overlap a center of the second inductor when viewed from the normal direction.

* * * * *